US008317922B2

(12) United States Patent
Lee et al.

(10) Patent No.: US 8,317,922 B2
(45) Date of Patent: Nov. 27, 2012

(54) GAS INJECTION UNIT AND THIN FILM DEPOSITION APPARATUS HAVING THE SAME

(75) Inventors: Chang Jae Lee, Gyeonggi-Do (KR); Young-Ho Kwon, Gyeonggi-Do (KR)

(73) Assignee: Jusung Engnineering Co., Ltd., Gyeonggi-Do (KR)

( * ) Notice: Subject to any disclaimer, the term of this patent is extended or adjusted under 35 U.S.C. 154(b) by 988 days.

(21) Appl. No.: 12/344,486

(22) Filed: Dec. 27, 2008

(65) Prior Publication Data

US 2009/0165717 A1 Jul. 2, 2009

(30) Foreign Application Priority Data

Dec. 31, 2007 (KR) .................. 10-2007-0141280

(51) Int. Cl.
*C23C 16/455* (2006.01)
*C23C 16/448* (2006.01)
*C23F 1/00* (2006.01)
*H01L 21/306* (2006.01)
*C23C 16/06* (2006.01)
*C23C 16/22* (2006.01)

(52) U.S. Cl. ... 118/715; 118/724; 118/726; 156/345.33; 156/345.34; 156/345.37

(58) Field of Classification Search .................. 118/715, 118/724, 726; 156/345.33, 345.34, 345.37
See application file for complete search history.

(56) References Cited

U.S. PATENT DOCUMENTS

| | | | | |
|---|---|---|---|---|
| 5,447,568 A * | 9/1995 | Hayakawa et al. | ........... | 118/715 |
| 5,653,806 A * | 8/1997 | Van Buskirk | ................. | 118/715 |
| 5,951,923 A * | 9/1999 | Horie et al. | ................ | 261/153 |
| 5,953,634 A * | 9/1999 | Kajita et al. | .................. | 438/687 |
| 6,507,698 B2 * | 1/2003 | Nagashima et al. | ........ | 392/389 |
| 6,656,284 B1 * | 12/2003 | Hwang et al. | ................. | 118/715 |
| 6,772,710 B2 * | 8/2004 | Lee | ........................ | 118/723 HC |
| 7,159,537 B2 * | 1/2007 | Wickramanayaka et al. | ........................ | 118/723 E |
| 7,381,274 B2 * | 6/2008 | Lee | ................................ | 118/715 |
| 7,462,245 B2 * | 12/2008 | Shimizu et al. | ............... | 118/726 |
| 7,712,434 B2 * | 5/2010 | Dhindsa et al. | ............. | 118/723 E |
| 7,827,931 B2 * | 11/2010 | Matsushima et al. | ..... | 118/723 E |
| 7,862,657 B2 * | 1/2011 | Onomura et al. | ............ | 117/200 |
| 8,157,916 B2 * | 4/2012 | Kim | ............................ | 118/726 |
| 2003/0044533 A1 * | 3/2003 | Lee | ........................ | 427/255.28 |
| 2004/0011292 A1 * | 1/2004 | Shimizu et al. | ......... | 118/723 VE |
| 2004/0011770 A1 * | 1/2004 | Strang et al. | ............. | 219/121.36 |
| 2004/0074609 A1 * | 4/2004 | Fischer et al. | ................ | 156/914 |
| 2004/0255858 A1 * | 12/2004 | Lee | ................................ | 118/715 |
| 2005/0003600 A1 * | 1/2005 | Kasai et al. | ................... | 438/200 |

(Continued)

FOREIGN PATENT DOCUMENTS

CN 1871694 11/2006

(Continued)

*Primary Examiner* — Rudy Zervigon

(57) ABSTRACT

A gas injection unit and a thin film deposition apparatus having the gas injection unit are provided. Since a variety of different kinds of organic materials can be sequentially vaporized and injected by a single injection unit, a variety of different kinds of thin films can be deposited in a single chamber. Furthermore, the gas injection structure of the injector unit can be easily controlled. Therefore, even when the process conditions such as the size of the substrate, the process temperature of the chamber, and the like are altered, it becomes possible to actively response to the altered process conditions by simply replacing some parts without replacing the whole injector unit.

12 Claims, 7 Drawing Sheets

U.S. PATENT DOCUMENTS

| | | | |
|---|---|---|---|
| 2005/0066900 A1* | 3/2005 | Liu et al. | 118/726 |
| 2006/0090705 A1* | 5/2006 | Kim | 118/726 |
| 2007/0234957 A1* | 10/2007 | Lee et al. | 118/715 |
| 2009/0165717 A1* | 7/2009 | Lee et al. | 118/724 |

FOREIGN PATENT DOCUMENTS

| | | |
|---|---|---|
| CN | 1977068 | 6/2007 |
| KR | 1020030020567 A | 3/2003 |
| KR | 1020060129279 A | 12/2006 |

* cited by examiner

GAS INJECTION UNIT AND THIN FILM DEPOSITION APPARATUS HAVING THE SAME

CROSS-REFERENCE TO RELATED APPLICATION

This application claims priority to Korean Patent Application No. 1.0-2007-0141280 filed on Dec. 31, 2007 and all the benefits accruing therefrom under 35 U.S.C. §119, the contents of which are incorporated by reference in their entirety.

BACKGROUND

The present disclosure relates to a gas injection unit and a thin film deposition apparatus having the same, and more particularly, to a gas injection unit that is configured to inject an organic material after vaporizing the organic material and a thin film deposition apparatus having the gas injection unit.

Generally, an organic light emitting device (OLED) is a display device that displays a desired image using a property of an organic light emitting material that is self-emissive when a voltage is applied thereto. The OLED is basically structured such that a pair of transparent and counter electrodes are stacked on a glass substrate and an organic thin film is inserted between the electrodes. Here, the organic thin film is formed by stacking a hole injection layer, a hole carrying layer, a light emitting layer, and an electron carrying layer to carry the electrodes and holes and emit light.

Unlike an inorganic material, the organic material used for forming the organic thin film does not require high vapor pressure and is easily dissolved and denaturalized at a high temperature. By this property of the organic material, in a related art, the organic thin film is deposited on the substrate through a process for charging the organic material in a pot formed of tungsten and vaporizing the organic material. However, in recent years, since there is a limitation in performing the process such as a limitation in an amount of the deposition material that can be stored in the pot, an injector with a heater has been used. The organic material is supplied to the injector and vaporized by the heater, after which the injector injects the vaporized organic material to the substrate.

However, each of a variety of stacked thin films of the OLED are deposited by vaporizing powders of different organic materials. Therefore, a related art method for manufacturing the OLED includes supplying a first organic material to the injector through a supplying tube, vaporizing the supplied first organic material, and injecting the first organic material to the glass substrate to deposit the thin film, after which supplying a second organic material to the injector, vaporizing the second organic material, and injecting the second organic material to deposit another thin film on the previously form thin film. Theses processes are repeated to stack other thin films one another. Therefore, the organic material that is previously used remains in the supplying tube and thus the current organic material is mixed with the previously used organic material and injected. Therefore, there is a limitation in that a desired thin film cannot be deposited.

Meanwhile, the injector disposed in a chamber has an undersurface facing the substrate. The undersurface is approximately flat and provided with a plurality of injection holes opened toward the substrate and thus the injector injects the vaporized material in a direction perpendicular to a plane of the substrate.

However, there is a need to control an injection structure of the injector depending on the occasion. For example, when a process environment such a size of the substrate or a kind of the thin film alters, there is a need to change the injection structure of the injector to use a current process apparatus as it is or achieve an optimum yield. Further, there is also need to alter the injection structure of the injector to restore the deformation of the injector structure due to a temperature of an interior of the chamber. However, the related art injector has an injector structure that is fixed in an initial state and thus it is impossible to change or control the injection structure. Accordingly, there is a limitation in that, when the process environment is altered, the apparatus must be entirely changed.

SUMMARY

The present disclosure provides a gas injection unit that is configured to deposit different kinds of thin films using different organic materials in a single chamber and a thin film deposition apparatus having the gas injection unit.

The present disclosure also provides a gas injection unit that is adapted to actively response to altered process conditions by controlling a gas injection structure thereof and a thin film deposition apparatus having the gas injection unit.

In accordance with an exemplary embodiment, a gas injection unit includes a supplying tube unit having a plurality of supplying tubes to which different materials are supplied; and an injector unit connected to the supplying tube unit, and provided with a passage communicating with the supplying tubes and one or more injection holes communicating with the passage and injecting gas, wherein at least one heat transferring member is provided on the passage.

A heating unit vaporizing the materials may be provided in the injector unit.

The heat transferring member may include a mesh or a ball.

The injector unit may include a first plate at a top surface of which a driving shaft for up and down movement and rotation is provided; a second plate provided with a passage communicating with a supplying passage of the supplying tube unit; and a third plate at an undersurface of which the injection holes communicating with the passage is provided, wherein the first, second, and third plates are sequentially stacked.

In accordance with another exemplary embodiment, a gas injection unit includes a supplying tube unit having a supplying tube to which a deposition material is supplied; and an injector unit connected to the supplying tube unit and provided with a passage communicating with the supplying tube and one or more injection holes communicating with the passage and injecting gas, wherein the injector unit includes an upper body and a lower body coupled to the upper body, and the upper and lower bodies are formed of different materials having different thermal expansion coefficients.

The upper and lower bodies may be formed of one of stainless steel (SUS), aluminum, and copper.

A heating unit vaporizing the deposition material may be provided in the injector unit.

A driving shaft for up and down movement and rotation may be provided at a top surface of the upper body, and a passage communicating with the supplying tube of the supplying tube unit may be provided in the upper body; and the injection holes communicating with the passage may be provided at an undersurface of the lower body.

In accordance with still another exemplary embodiment, a gas injection unit includes a supplying tube unit having a supplying tube to which a deposition material is supplied; an injector unit connected to the supplying tube unit and provided with a passage communicating with the supplying tube and one or more injection holes communicating with the passage and injecting gas; and a deformation control plate which is coupled to one surface of the injection unit on which the injection holes are formed, and formed of metal having a different thermal expansion coefficient from the injector unit.

The injector unit and the deformation control plate may be formed of one of stainless steel (SUS), aluminum, and copper.

The deformation control plate may be formed on a portion of or all over the one surface of the injector unit.

The deformation control plate may be provided with second injection holes perforating in a vertical direction corresponding to the respective injection holes.

A heating unit configured to vaporize the deposition material may be provided in the injector unit.

In accordance with still yet another exemplary embodiment, a thin film deposition apparatus includes a chamber providing a depositing space; a substrate supporting base disposed in the chamber and configured to support a substrate; and a gas injection unit disposed facing the substrate supporting unit, wherein the gas injection unit includes a supplying tube unit having a supplying tube to which a deposition material is supplied; and an injector unit connected to the supplying tube unit and provided with a passage communicating with the supplying tube and one or more injection holes communicating with the passage and injecting gas, wherein at least one heat transferring member is provided on the passage.

The supplying tube may be provided in plurality so that different depositing materials are respectively supplied thereto, and the passage may communicate with the supplying tubes.

The injector unit may include an upper body and a lower body coupled to the upper body, and the upper and lower bodies are formed of different materials having different thermal expansion coefficients.

The upper and lower bodies may be formed of one of stainless steel (SUS), aluminum, and copper.

The thin film deposition apparatus may further include a deformation control plate which is coupled to one surface of the injection unit on which the injection holes are formed, and formed of metal having a different thermal expansion coefficient from the injector unit.

The injector unit and the deformation control plate may be formed of one of stainless steel (SUS), aluminum, and copper.

BRIEF DESCRIPTION OF THE DRAWINGS

Exemplary embodiments can be understood in more detail from the following description taken in conjunction with the accompanying drawings, in which.

DETAILED DESCRIPTION OF EMBODIMENTS

Figure 1:
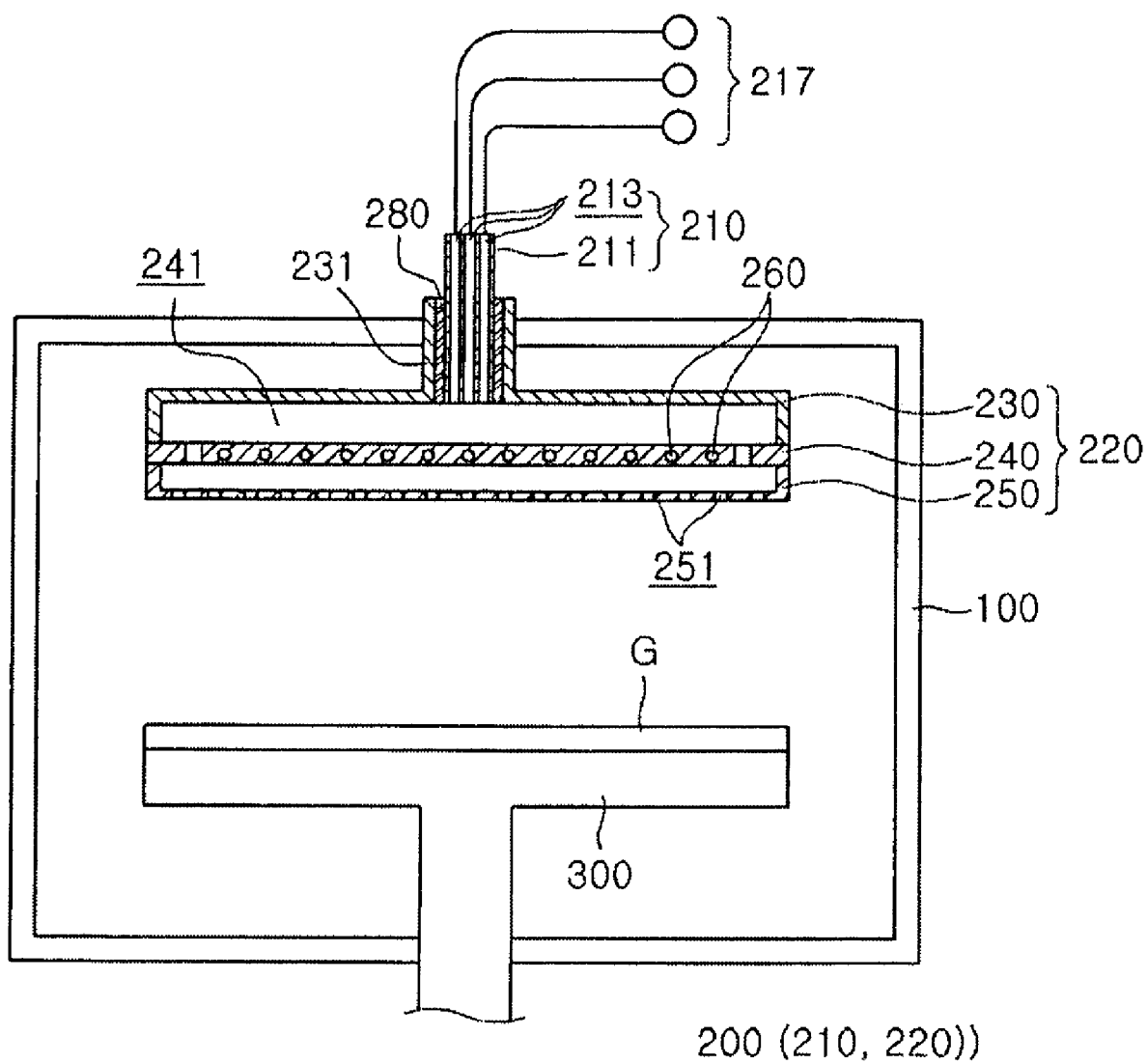
FIG. 1 is a schematic view of a thin film deposition apparatus in accordance with an exemplary embodiment.

Hereinafter, specific exemplary embodiments will be described in detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Like reference numerals refer to like elements throughout.

Embodiment 1

FIG. 1 is a schematic view of a thin film deposition apparatus in accordance with an exemplary embodiment.

Referring to FIG. 1, the thin film deposition apparatus includes a chamber 100, a gas injection unit 200 disposed in the chamber 100, and a substrate supporting base 300 facing the gas injection unit 200 and supporting a substrate G such as a semiconductor wafer or a glass substrate.

The chamber 100 is formed in a cylindrical shape but the shape may be varied in accordance with a shape of a semiconductor wafer or a glass substrate (referred to as a substrate hereinafter). The chamber has a closed top and a closed bottom, and a predetermined space in which the gas injection unit 200 and the substrate supporting base 300 are disposed. At this point, although not shown in FIG. 1, a gate (not shown) through which the substrate G comes in and goes out may be formed on a sidewall of the chamber 100. A discharging unit (not shown) may be provided on the bottom of the chamber 100 to discharge the gas out of the chamber 100. Although the description is made on the chamber 100 having the closed top and bottom, the chamber 100 may be divided into a lower chamber and a chamber lid.

The gate (not shown) is formed on a side of the chamber 100 to guide the substrate G going in or coming out from the chamber 100. At this point, another gate may be further formed on an opposite side of the chamber 100. In addition, the discharging unit (not shown) is disposed under the chamber 100 to discharge reaction byproducts and gas that are generated during deposition out of the chamber 100. Alternatively, the discharging unit may be formed on a sidewall of the chamber in addition to the portion under the chamber 100. Alternatively, a plurality of discharging units may be provided.

The gas injection unit 200 is for injecting a deposition material such as, for example, organic powder supplied from an external side of the chamber 100 to the substrate G. In this embodiment, the gas injection unit 200 employs an injector type. Such a gas injection unit 200 includes a supply tube unit 210 having a plurality of supplying tubes through which different materials are supplied and an injector unit 220 provided with a plurality of injection holes 251 and a passage 241 communicating with the injection holes 251. At this point, a sealing unit 280 is provided on a connecting portion between the supplying tube unit 210 and the injector unit 220. The sealing unit may be a cylindrical magnetic seal.

The supplying tube unit 210 has one main supplying tube 211 and a plurality of sub-supplying tubes 213 that are disposed in the main supplying tube to supply different materials. At this point, the sub-supplying tubes 213 are connected to respective material supplying units 217 supplying the different materials and disposed at the external side of die chamber 100 to function as passages through which the different materials are supplied. Further, the sub-supplying tubes 213 are further connected to respective gas supplying tubes (not shown) connected to an inert gas supplying source (not shown) disposed at the external side of the chamber 100. The gas supplying tubes supply independently the inert gas to the respective sub-supplying tube 213.

At this point, the supplying tube unit 210, i.e., the main supplying tube 211 is installed through the top of the chamber 100 and the injector unit 220 is connected to an end of the main supplying tube 211 so that the passage 241 formed in the injector unit 220 communicates with the sub-supplying tubes 213. It is apparent that the supplying tube unit 210 is not limited to the structure illustrated in FIG. 1. Any structure will be possible as long as it can independently supply the different materials to the passage 241 of the injector unit 220. For example, the supplying tube unit 210 may be configured such that the sub-supplying tubes supplying independently the different materials are connected to a side of the injector unit 220 to communicate with the passage 241.

The passage 241 is formed in the injector unit 220 and the injection holes 251 are provided at the bottom of the injector unit 220. The injection holes 251 communicate with the passage 241. A heating unit 260 for vaporizing the deposition material is provided to the injector unit 220. Therefore, the different materials that are sequentially supplied through the supplying tube unit 210 are vaporized by the heating unit 260 and injected through the injection holes 251, thereby being deposited on the substrate G.

The gas injection unit 200 will be described in more detail later.

The substrate supporting base 300 is formed in a shape corresponding to a shape of the substrate G. A driving member (not shown) is connected to a lower portion of the substrate supporting base 300 to move the substrate supporting base 300 in a vertical direction or to rotate the substrate supporting base 300. Here, one or more substrates G may be disposed on the substrate supporting base 300. Further, the driving member for moving and rotating the substrate supporting base 300 is formed in a single unit. However, the driving member may be divided into two different units for respectively moving and rotating the substrate supporting base 300.

Further, the substrate supporting unit 300 may be provided with a substrate heating unit (not shown) for heating the substrate G. That is, the substrate heating unit applies heat to the substrate G seating on the substrate supporting unit 300 to provide a desired temperature required for the deposition. Here, a core heater may be provided in the substrate supporting unit 300 as the substrate heating unit. Alternatively, a separate lamp may be connected to an undersurface of the substrate supporting base 300 to heat the substrate supporting unit 300 on which the substrate G seats.

Figure 2:
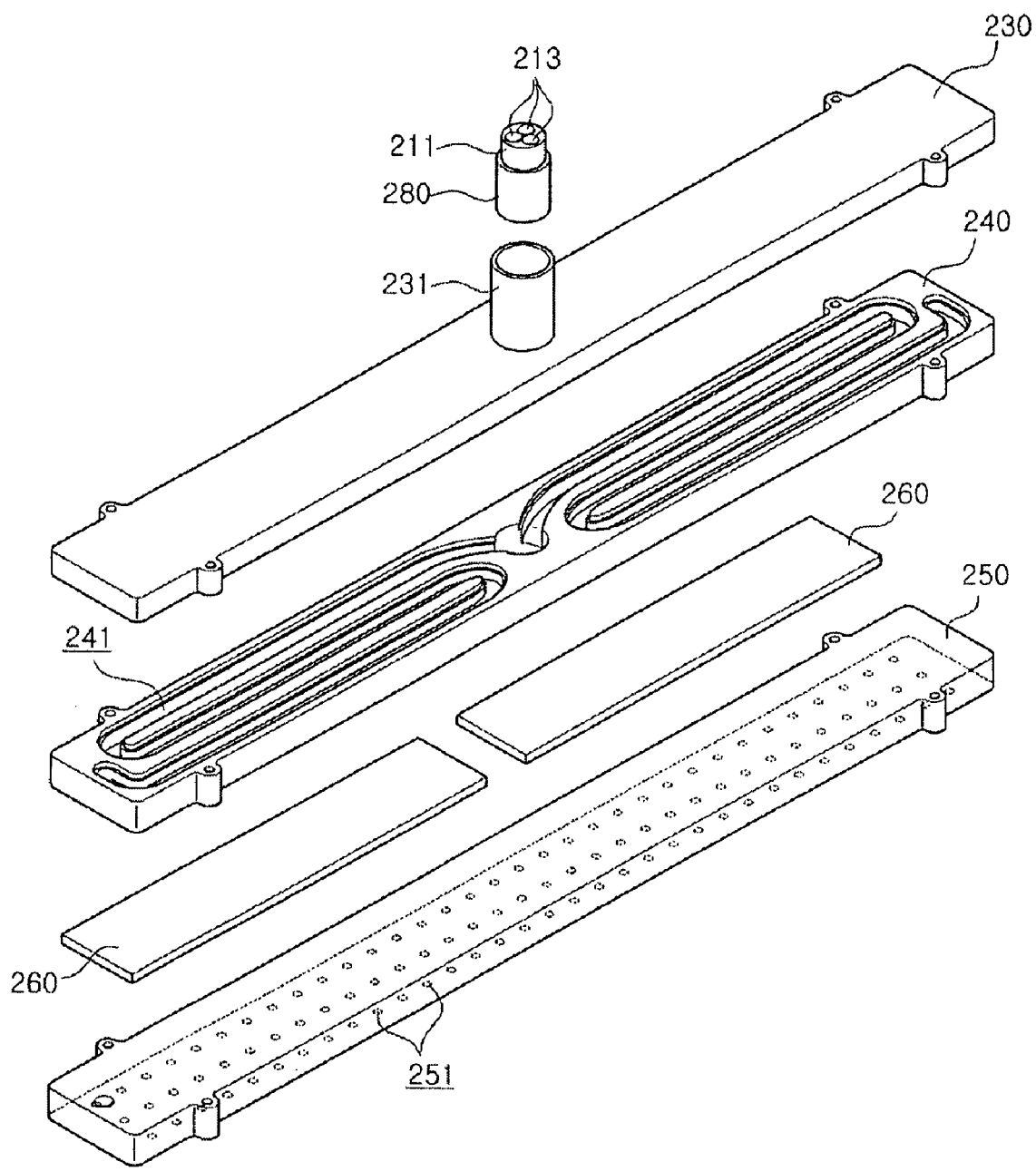
FIG. 2 is an exploded perspective view of a gas injection unit in accordance with an exemplary embodiment.
Figure 3:
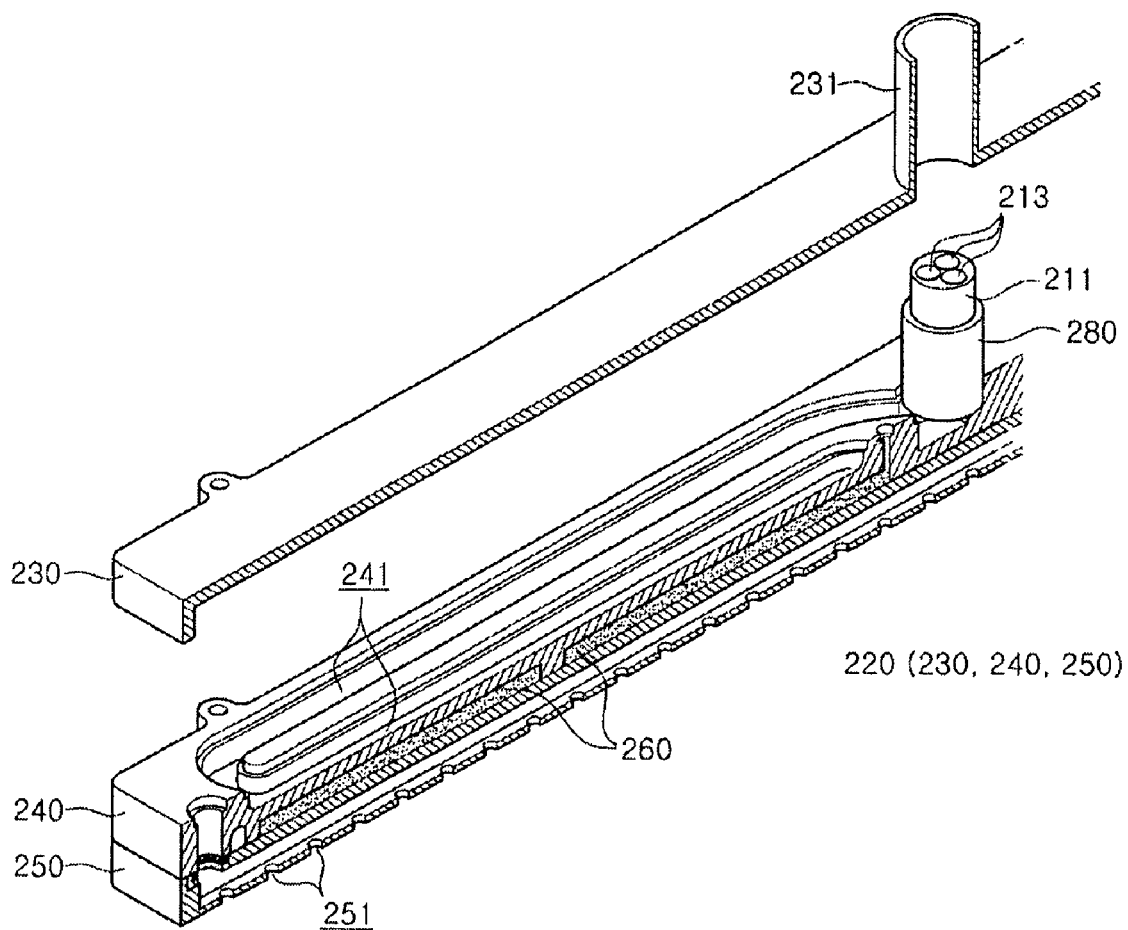
FIG. 3 is a partially sectioned perspective view of the gas injection unit in accordance with the embodiment of FIG. 2.

FIG. 2 is an exploded perspective view of a gas injection unit in accordance with an exemplary embodiment and FIG. 3 is a partially sectioned perspective view of the gas injection unit in accordance with the embodiment of FIG. 2.

Referring to FIGS. 2 and 3, the gas injection unit 200 includes the supplying tube unit 210 to which different powders are independently supplied and the injection unit 220 which is connected to an end portion of the supplying tube unit 210 and injects the powders after vaporizing the powders.

As previously described, the supplying tube unit 210 includes one supplying tube 211 and the plurality of sub-supplying tubes 213 that has an identical sectional area and is disposed in the supplying tube 211 to supply the different materials and inert gas independently. It is apparent that the gas injection unit 200 is not limited to the above configuration. For example, one supplying tube 211 is provided and the interior of the supplying tube 211 is divided by partitions to define a plurality of supplying passages.

The injector unit 220 vaporizes the deposition material supplied from the supplying tube unit 210 and injects the vaporized material toward the substrate G. The injector unit 220 has a body divided into first, second, and third plates 230, 240, and 250 that are stacked one another.

A driving shaft 231 for the up and down movement and rotation is provided on a lop surface of the first plate 230. The driving shaft 231 is installed through the top of the chamber 100 and the supplying tube unit 210 is inserted in the driving shaft 231. At this point, a sealing unit 280 such as a magnetic seal is provided between the driving shaft 231 and the supplying tube unit 210 to rotate the injector unit 220 by rotating the driving shaft 231 with the supplying tube unit 210 fixed. The driving member (not shown) for moving the injector unit 220 in the vertical direction and rotating the injector unit 220 is connected to the driving shaft 231. The driving member for moving and rotating the substrate supporting base 300 is formed in a single unit. However, the driving member may be divided into two different units for respectively moving and rotating the substrate supporting base 300.

The second plate 240 is provided with the passage 241 communicating with an end portion of the supplying passage (or the sub-supplying tubes) of the supplying tube unit. The deposition material supplied flows along the passage 241. At this point, the supplying passage (or the sub-supplying tubes) extends to the passage 241 to directly communicate with the passage 241 and thus to prevent the deposition material from being deposited on other components such as the scaling unit 280.

The heating unit 260 for vaporizing the deposition material flowing along the passage 241 is provided adjacent to the passage 241. Any kinds of the heating device that can increases a temperature to a level at which the deposition material can be vaporized can be used as the heating unit 260. For example, the core heater or lamp heater may be used as the heating unit. Further, the installing position of the heating unit 260 is not limited specifically. However, the heating unit 260 may be disposed under the passage 241.

The passage 241 may be lengthened enough to vaporize the deposition material flowing along therein. In order to prevent the deposition material from flowing back toward the supplying tube unit 210, the passage 241 has a greater sectional area than the supplying passage (sub-supplying tube) provided in the supplying tube unit 210. For example, the sectional area of the passage 241 may be 140% or more of the sectional area of the supplying passage (sub-supplying tube).

One or more heat transferring members 271 and 273 may be provided in the passage 241 so that the deposition material can receive energy (heat) as much as possible.

Figure 4:
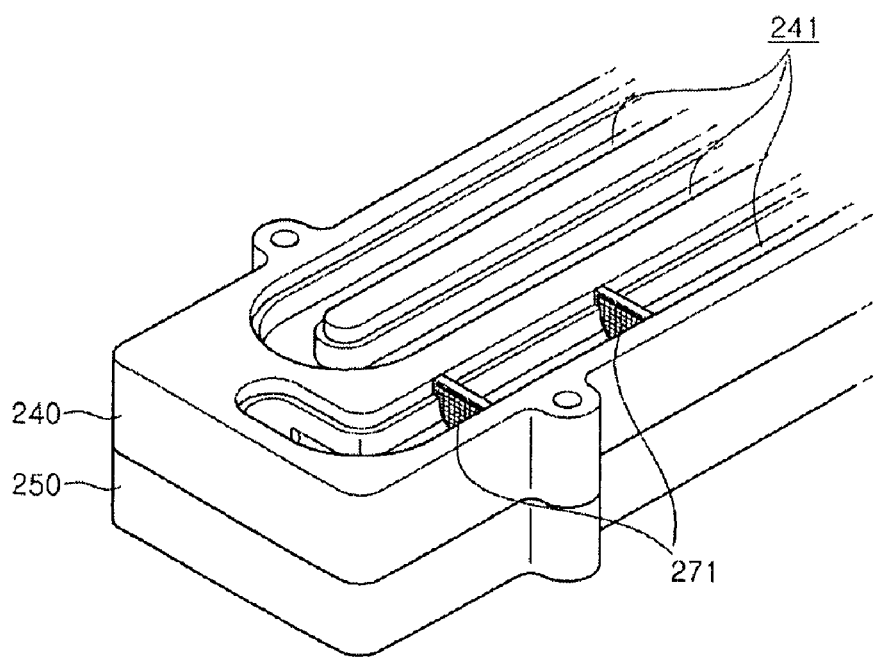
FIG. 4 is a perspective view of a major portion of a modified example of the gas injection unit of FIGS. 2 and 3.
Figure 5:
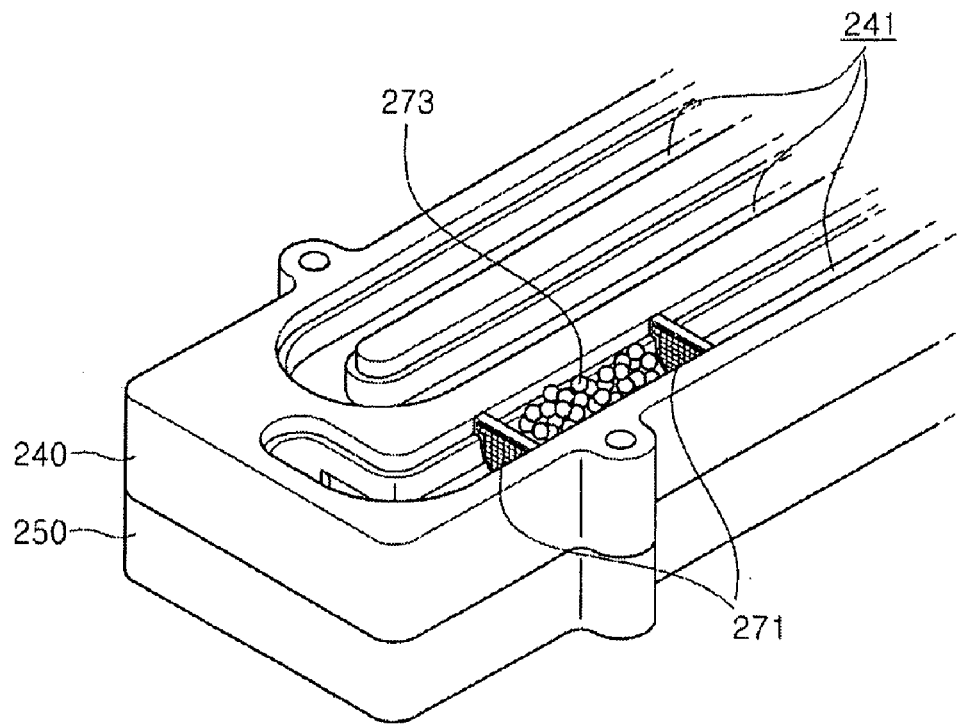
FIG. 5 is a perspective view of a major portion of another modified example of the gas injection unit of FIGS. 2 and 3.

FIG. 4 is a perspective view of a major portion of a modified example of the gas injection unit of FIGS. 2 and 3, and FIG. 5 is a perspective view of a major portion of another modified example of the gas injection unit of FIGS. 2 and 3. As shown in the drawings, the heat transferring members may be formed of meshes 271 or balls 273.

The deposition material flowing in the injector unit 220 is vaporized while passing through the interior of the passage 241 heated by the heat supplied by the heating unit 260. At this point, the deposition material receives the heat while contacting the inner wall of the passage 241. At this point, when the meshes 271 or balls 273 that constitutes the heat transferring member are provided in the passage 241, a heat transferring area through which the deposition material can receive the heat while contacting the meshes 271 or the balls 273 increases and thus the vaporization rate increases. That is, the deposition material flowing in the passage can be stably vaporized through the heat transferring members 271 and 273. The balls 273 may be formed of ceramic or metal. For example, the balls 273 may be formed of ceramic to prevent the generation impurities due to the contact between the balls 273.

The meshes 271 are limited to a specific configuration. That is, the meshes 271 may have a regular or irregular pattern or a lattice structure. The balls 273 are not also limited to a specific shape. That is, the balls 273 are formed in a random shape, i.e., a variety of polyhedron shape.

The meshes 271 and balls 273 may be simultaneously or separately used and the numbers and installing positions of the meshes 271 and balls 273 are not specifically limited but may vary depending on the kind of the deposition material and process conditions.

The passage 241 of the second plate 240 extends to the third plate 250 and the injection holes 251 injecting the vaporized material are formed on a rear end of the passage 241.

Although the injector unit 220 is divided into the first, second, and third plates 230, 240, and 250 to easily form the driving shaft 231, passage 241, and injection holes 251, the injector unit 220 is not limited to this configuration. The injector unit 220 may be formed in a monolithic body as far as it can form the driving shaft 231, 241, and 251.

Further, although the injector unit 220 is provided in the form of a bar type, any types may be possible as far as it can form the driving shaft 231, passage 241, and injection holes 25. For example, the injector unit 220 may be formed in a disk type in response to the shape of the substrate supporting base 300 and the shape of the interior of the chamber 100.

The following will describe a thin film deposition method using the thin film deposition apparatus of the embodiment.

First, when one or more substrates G seat on the substrate supporting base 300 in the chamber 100, first organic powder that is the depositing material is supplied from one of the material supplying units 217 to the corresponding one of the sub-supplying tubes 213. At this point, the sub-supplying tubes 213 that are not selected are supplied with inert gas to prevent the organic powder that are being supplied from flowing back. The supplied organic powder passes through the passage 241 of the injector unit 220. At this point, the first organic powder in the passage 241 is vaporized by the heat generated by the heating unit 260 that is disposed adjacent to the passage 241. The vaporized organic powder is injected to the substrate G trough the passage 241 and the injection holes 25, thereby forming a first organic thin film on the substrate G.

When the organic thin film is formed on the substrate G, the supply of the organic powder is stopped and a purge process for discharging the first organic powder remaining in the space where the organic powder is vaporized by supplying the inert gas (purge gas) to the sub-supplying tube 213. After the purge process, second organic powder is supplied from another one of the material supplying units 217 to another one of the sub-supplying tube 213. Like the above, the sub-supplying tubes 213 that are not selected are supplied with inert gas to prevent the organic powder that are being supplied from flowing back. Like the first organic powder, the second organic powder is vaporized while passing through the passage 241 and injected to the substrate G through the injection holes 251 wise, thereby forming a second organic thin film on the first organic thin film formed on the substrate G. Other organic films are formed on one another through the above-described process. Needless to say, the purge process for discharging the remaining organic powder that was previously supplied and a gas discharging process for discharging the inert gas remaining the chamber 100 will be also performed.

The process for injecting the deposition material and the process for purging the space in which the deposition material is vaporized are repeated by the number corresponding to the number of the deposition materials and thus different organic thin films can be formed on the substrate G in the chamber 100.

Embodiment 2

The following will describe a thin film deposition apparatus according to other embodiments. At this point, parts identical to those of the previous embodiment will not be described and like reference numerals will be used to refer to the like parts.

Figure 6:
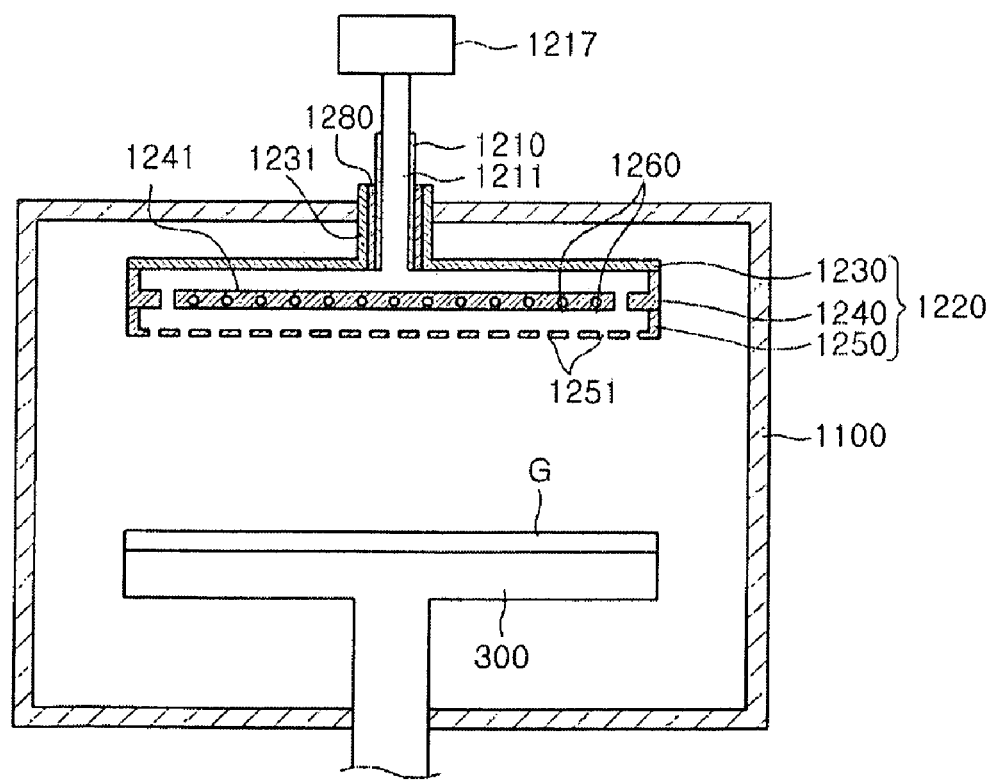
FIG. 6 is a schematic view of a thin film deposition apparatus according to another exemplary embodiment.

FIG. 6 is a schematic view of a thin film deposition apparatus according to another exemplary embodiment.

Referring to FIG. 6, the thin film deposition apparatus includes a chamber 100, a substrate supporting base 300 disposed in the chamber 100 and supporting a substrate G, and a gas injection 1200 disposed facing the substrate supporting base 300.

The gas injection unit 1200 is for injecting a deposition material supplied from a material supply unit 1217 disposed at to an external side of the chamber 100 to the substrate G. The gas injection unit 1200 is provided in the form of an injector type where the organic material is supplied in the form of powder and which vaporizes the supplied material and injects the vaporized material while rotating. Such a gas injection unit 1200 includes a supply tube unit 1210 having a supplying tube 1211 to which the material is supplied and an injector unit 1220 receiving the deposition material from the supplying tube unit 1210 and injecting the depositing material after vaporizing the deposition material. At this point, a sealing unit 1280 is provided on a connecting portion between the supplying tube unit 210 and the injector unit 220. The sealing unit 1280 may be a cylindrical magnetic seal.

At least one supplying tube 1211 is disposed in the supplying tube unit 1210. A first end of the supplying tube 1211 is connected to the material supplying unit 1217 disposed at the external side of the chamber 100 to receive the deposition material from the materially supplying unit 1217. Further, The supplying tube 1211 may be also connected to an inert gas supplying unit (not shown) disposed at the external side of the chamber 100 to receive the inert gas from the inert gas supplying unit (not shown). The inert gas is supplied to discharge the deposition material remaining the vaporizing space after the thin film process is finished. Meanwhile, the supplying tube unit 1210 is installed through a top of the chamber 100 and has a first end connected to the injector unit 1220 to communicate the passage 1241 formed in the injector unit 1220 with the supplying tube 1211 provided in the supplying tube unit 1210.

The injector unit 1220 is provided at the interior thereof with the passage 1241 and at the undersurface thereof with the injection holes 1251. The injection holes 1251 communicate with the passage 1241. Further, a heating unit 1260 for vaporizing the deposition material is provided in the injector unit 1220. Therefore, the deposition material supplied to the passage 1241 is vaporized by the heating unit 1260 and injected to the substrate G through the injection holes 1251 to be deposited on the substrate G. Particularly, the injector unit 1220 has upper and lower parts formed of different metals having different thermal expansion coefficients. This is to lead to the deformation of the injection plane of the injector in accordance with the temperature variation. Therefore, the injection direction of the vaporized deposition material can be controlled within a predetermined range. The following will described the injector unit 1220 in more detail with reference to the accompanying drawings.

Figure 7:
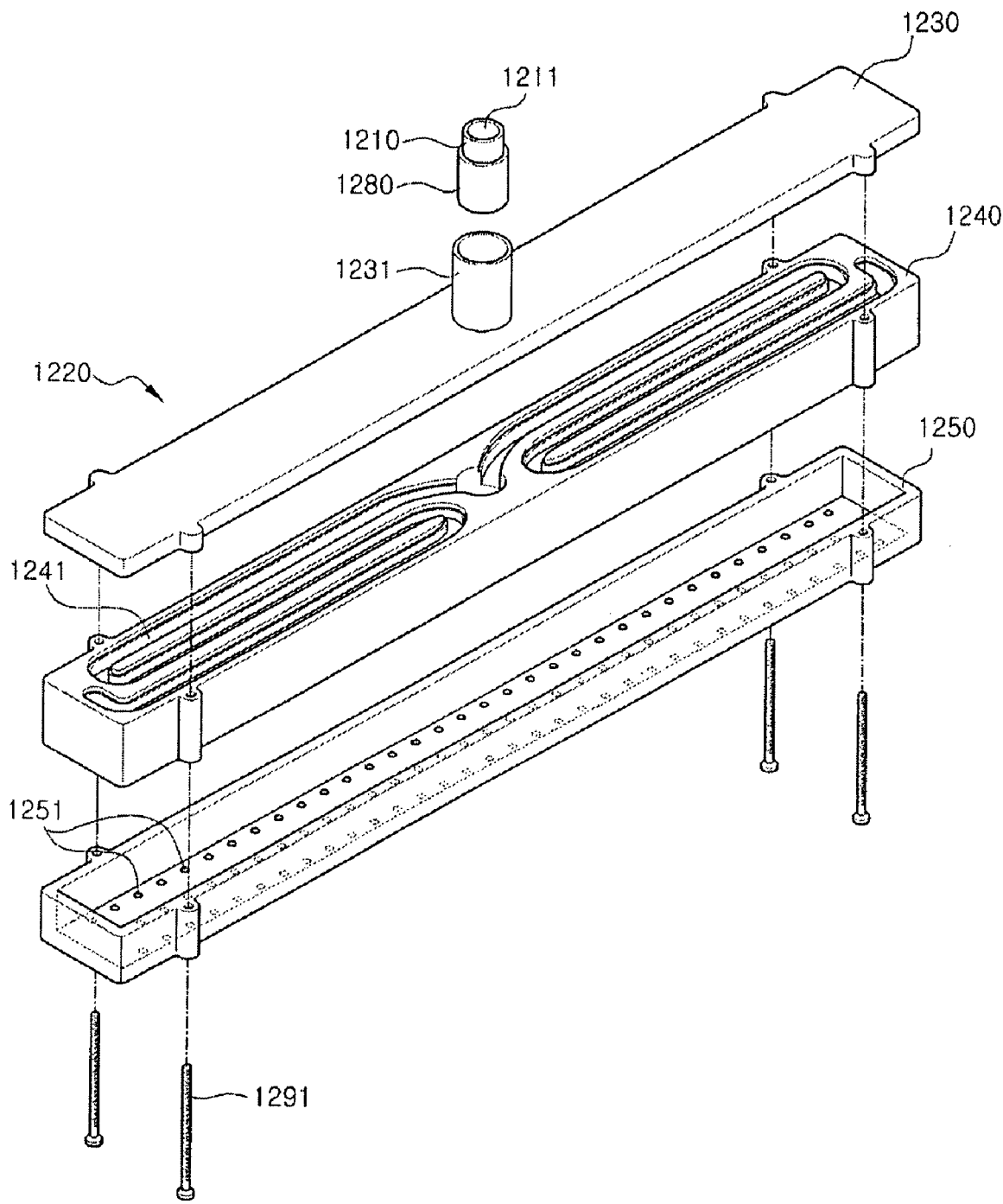
FIG. 7 is an exploded perspective view of a gas injection unit according to the embodiment of FIG. 6.
Figure 8:
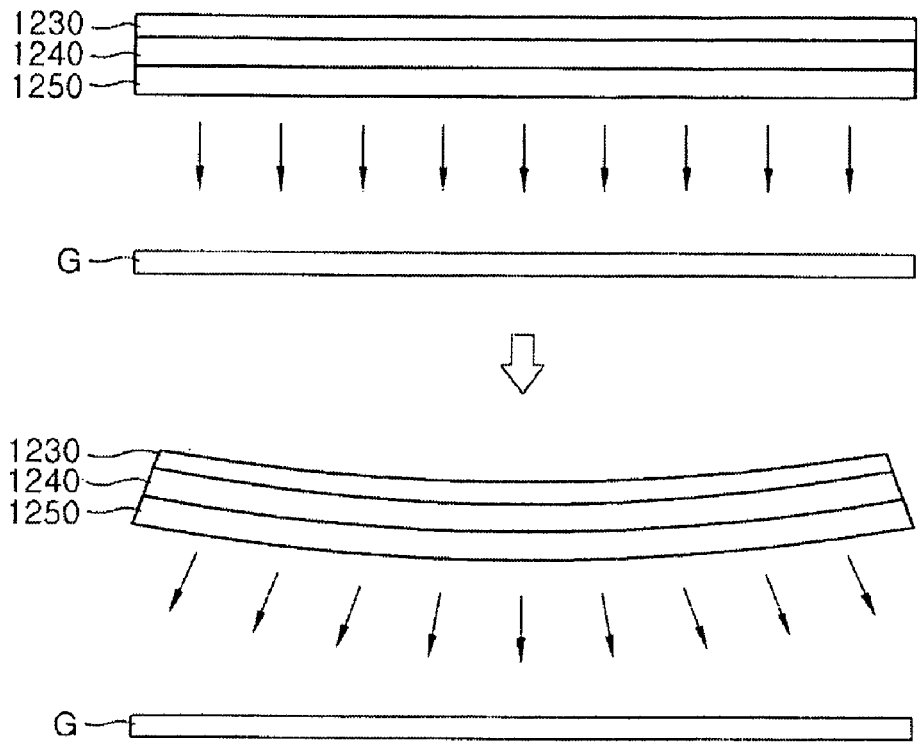
FIGS. 8 and 9 are schematic views illustrating a deformed state of the gas injection unit of FIG. 7 in accordance with the thermal expansion.
Figure 9:
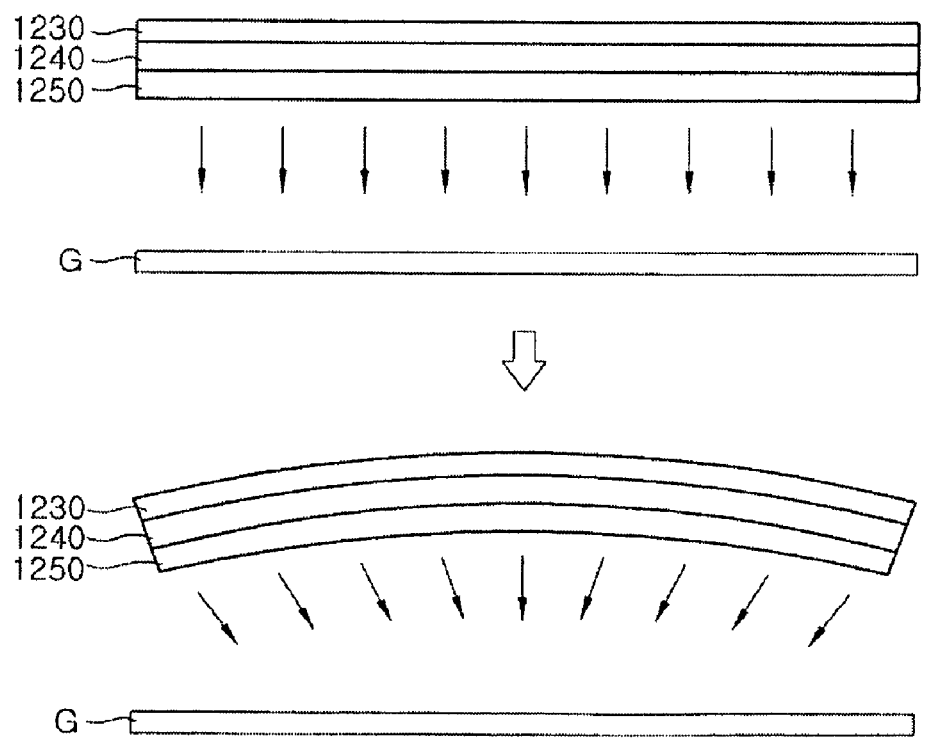

FIG. 7 is an exploded perspective view of a gas injection unit according to the embodiment of FIG. 6 and FIGS. 8 and 9 are schematic views illustrating a deformed state of the gas injection unit of FIG. 7 in accordance with the thermal expansion.

Referring to FIG. 7, the injector unit 1220 includes an upper plate (a first plate) 1230, a lower plate (a third plate) 1250 under the upper plate (a first plate) 1230, and a heating plate (a second plate) 1240 disposed between the upper and lower plates 1230 and 1250. The lower, heating, and upper plates 1250, 1240, and 1230 are stacked one another in this order and are coupled at edges thereof with each other by screws 1291. Needless to say, they may be coupled to each other by welding.

A driving shaft 1231 is provided on a top surface of the first plate 1230. The driving shaft 1231 is installed through the top of the chamber 100 and the supplying tube unit 1210 is inserted in the driving shaft 1231. At this point, At this point, a sealing unit 1280 such as a magnetic seal is provided between the driving shaft 1231 and the supplying tube unit 1210 to rotate the injector unit 1220 by rotating the driving shaft 1231 with the supplying tube unit 1210 fixed. The driving member (not shown) for moving the injector unit 1220 in the vertical direction and rotating the injector unit 1220 may be connected to the driving shaft 1231. The driving member for moving and rotating the injector unit 1220 is formed in a single unit. However, the driving member may be divided into two different units for respectively moving and rotating the injector unit 1220.

The second plate 1240 is provided with the passage 1241 communicating with an end portion of the supplying tube 1211 of the supplying tube unit 1210. At this point, the supplying tube 1211 extends to the passage 1241 to directly communicate with the passage 1241 and thus to prevent the deposition material from being deposited on other components such as the sealing unit 1280. The heating unit (not shown) for vaporizing the deposition material flowing along the passage 1241 is buried in the second plate 1240. Any kinds of the heating device that can increases a temperature to a level at which the deposition material can be vaporized can be used as the heating unit. For example, the core heater or lamp heater may be used as the heating unit. Needless to say, the heating unit may be disposed adjacent to the passage 1241 rather than being buried in the second plate 1240. The passage 1241 may be lengthened enough to vaporize the deposition material flowing along therein. Therefore, the deposition material flowing in the injector unit 1220 is vaporized while passing through the passage 1241 heated by the heating unit 1260.

The passage 1241 of the second plate 1240 extends to the third plate 1250 and the injection holes 1251 injecting the vaporized material are formed on a rear end of the passage 1241. The injection holes 1251 are opened toward the substrate and uniformly distributed with respect to the entire area of the substrate.

Meanwhile, the first and second plates 1230 and 1240 disposed above the third plate 1250 may be formed of first metal and the third plate 1250 may be formed of second metal different in the thermal expansion coefficient from the first metal. At this point, the first and second plates 1230 and 1240 may have higher or lower thermal expansion coefficient than the third plate 1250. In addition, a thermal expansion coefficient ratio of the first/second plate 1230/1240 to the third plate 1250 may be high or low. This is because that the optimal injection structure of the injector 1220 varies depending on the process environments. Therefore, when the optical gas injection structure of the injector unit 1220 is first set depending on a variety of process environments such as a size of the substrate, a kind of the thin film, and a process temperature, the thermal expansion coefficient ratio of the first/second plate 1230/1240 to the third plate 1250 may be high or low is determined. As described above, the injector unit 1220 is formed by the first and second plates 1230 and 1240 to the third plate 1250 having a different thermal expansion coefficient to the first and second plates 1230 and 1240. For example, the injector unit 1220 may be formed by coupling of stainless steel and copper, stainless steel and aluminum, or copper and aluminum, or the like. Any two different metals having different thermal expansion coefficients may be possible.

For example, in this exemplary embodiment, the first and second plates 1230 and 1240 are formed of stainless steel (SUS) and the third plate 1250 is formed of aluminum. Therefore, the first and second plates 1230 and 1240 have thermal expansion coefficient of approximately $1.7 \times 10^{-16}$ mm/° C. and the third plate 1250 has thermal expansion coefficient of approximately $23 \times 10^{-16}$ mm/° C. When each of initial lengths of the first, second, and third plates 1230, 1240, and 1250 is 100 mm and the temperature increases to 50° C., the length of the first/second plate 1230/1240 increases to 1008.5 mm while the length of the third plate 1250 increases to 1011.5 mm. At this point, since the first, second, and third plates 1230, 1240, and 1250 are securely fixed to each other by the screws 1291, the third plate 1250 having a higher deformable force than the first and second plates 1230 and 1240 restrains the first and second plates 1230 and 1240 to forcedly deform the first and second plates 1230 and 1240. Therefore, as shown in FIG. 8, an overall body of the injector unit 1220 is deformed to be convex downward and thus opening directions of the injection holes vary to change injection angles outward from the center of the substrate G. As a result, after the injector 1220 is deformed, the injection density for the central region of the substrate G is lowered as compared with before the injector 1220 is deformed.

Needless to say, unlike the above, when the first, second, and third plates 1230, 1240, and 1250 are formed of opposite metals, as shown in FIG. 9, an overall body of the injector unit 1220 is deformed to be convex upward and thus opening directions of the injection holes vary to change injection angles toward the center of the substrate G. As a result, after the injector 1220 is deformed, the injection density for the central region of the substrate G increases as compared with before the injector 1220 is deformed.

As described above, since the upper and lower parts of the injector unit 1220 are formed of different metals having different thermal expansion coefficients, the shape of the body of the injector unit 1220 varies in accordance with the variation of the temperature. That is, it is possible to control the injecting direction of the gas injection structure of the injector unit 1220. Therefore, even when the process conditions such as the size of the substrate, the process temperature of the chamber, and the like are altered, it becomes possible to actively response to the altered process conditions by simply replacing the first and second plates 1230 and 1240 or the third plate 1250 without replacing the whole injector unit 1220.

Embodiment 3

Figure 10:
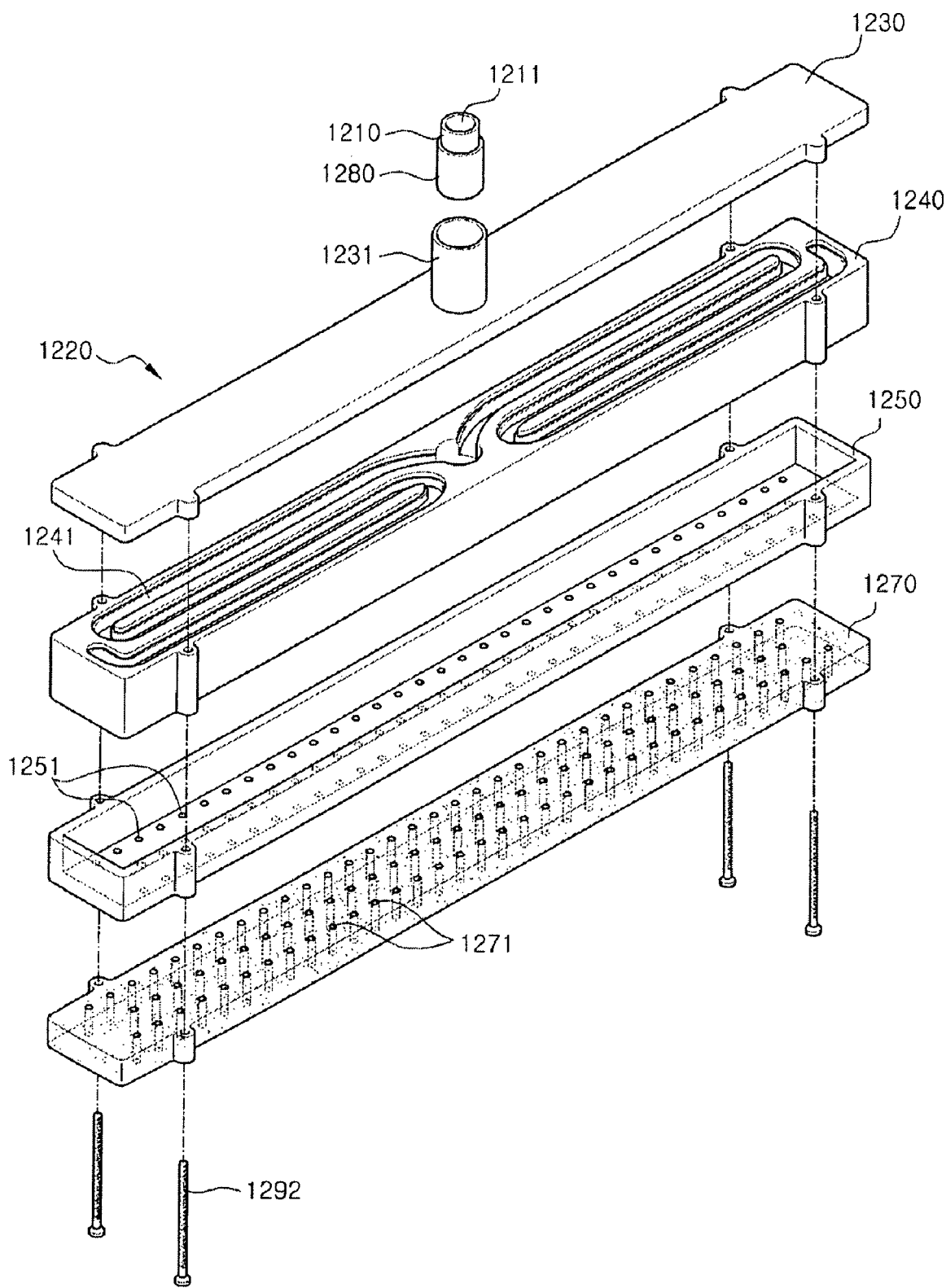
FIG. 10 is an exploded perspective view of a gas injection unit according to another exemplary embodiment.

FIG. 10 is an exploded perspective view of a gas injection unit according to another exemplary embodiment.

Referring to FIG. 10, a gas injection unit includes an injector unit 1220 having first, second, and third plates 1230, 1240, and 1250 that are stacked one another. The gas injection unit further includes a deformation control plate 1270 coupled to one surface, i.e., an undersurface of the injector unit 1220. At this point, the deformation control plate 1270 is provided with second injection holes 1291 corresponding to communicating with injection holes 1251 formed on an undersurface of the injector unit 1220. The second injection holes 1291 perforate in the vertical direction. At this point, the size of each of the second injection holes 1291 may be identical, smaller, or greater than that of the corresponding injection hole 1251 in accordance with the thermal expansion coefficient of the deformation control plate 1270.

The first, second, and third plates 1230, 1240, and 1250 of the body of the injector unit 1220 are formed of identical metal such as stainless steel (SUS). The deformation control plate 1270 is formed of metal such as aluminum having a different thermal expansion coefficient from the first, second, and third plates 1230, 1240, and 1250.

Meanwhile, since the deformation control plate 1270 may be formed independent of the injector unit 1220 and thus has a variety of advantages. For example, the size of the deformation control plate 1270 is not necessarily identical to that of the injector unit 1220, nor to be designed to cover an entire region of the injector unit 1220. Therefore, the gas injection structure of the injector unit 1220 can be more freely controlled. Specifically, the deformation control plate 1270 may be coupled to the undersurface of the injector unit 1220 by fasteners such as screws 1292, so that it can be easily detached from the injector unit 1220.

According to the embodiments, since a variety of different kinds of organic materials can be sequentially vaporized and injected by a single injection unit, a variety of different kinds of thin films can be deposited in a single chamber and thus the productivity increases and the cost can be reduced.

Further, since a heat transferring member is provided on the passage of the gas injection unit to improve the vaporization rate, a high quality thin film can be stably formed.

Furthermore, The gas injection structure of the injector unit can be easily controlled. Therefore, even when the process conditions such as the size of the substrate, the process temperature of the chamber, and the like are altered, it becomes possible to actively response to the altered process conditions by simply replacing some parts without replacing the whole injector unit.

Although the gas injection unit and thin film deposition apparatus having the gas injection unit have been described with reference to the specific exemplary embodiments, they are not limited thereto. Therefore, it will be readily understood by those skilled in the art that various modifications and changes can be made thereto without departing from the spirit and scope of the present invention defined by the appended claims.

What is claimed is:

1. A gas injection unit comprising:
a supplying tube unit having a plurality of supplying tubes to which different materials are supplied;
an injector unit connected to the supplying tube unit, and provided with a passage communicating with the supplying tubes and one or more injection holes for communicating with the passage and injecting gas; and
at least one heat transferring member provided on the passage,
wherein the injector unit comprises an upper body and a lower body coupled to the upper body; a driving shaft for up and down movement and rotation is provided at a top surface of the upper body; the passage communicating with the supplying tubes is provided within the upper body; and the injection holes communicating with the passage is provided at an undersurface of the lower body.

2. The gas injection unit of claim 1, wherein a heating unit vaporizing the materials is provided in the injector unit.

3. The gas injection unit of claim 1, wherein the heat transferring member comprises a mesh or a ball.

4. The gas injection unit of claim 1, wherein the injector unit comprises:
a first plate at a top surface of which a driving shaft for up and down movement and rotation is provided;
a second plate provided with a passage communicating with a supplying passage of the supplying tube unit; and
a third plate at an undersurface of which the injection holes communicating with the passage are provided,
wherein the first, second, and third plates are sequentially stacked.

5. A gas injection unit comprising:
a supplying tube unit having a supplying tube to which a deposition material is supplied; and
an injector unit connected to the supplying tube unit and provided with a passage communicating with the supplying tube and one or more injection holes for communicating with the passage and injecting gas,
wherein the injector unit comprises an upper body and a lower body coupled to the upper body, and the upper and lower bodies are formed of different materials having different thermal expansion coefficients; a driving shaft for up and down movement and rotation is provided at a top surface of the upper body; the passage communicating with the supplying tubes is provided within the upper body; and the injection holes communicating with the passage is provided at an undersurface of the lower body.

6. The gas injection unit of claim 5, wherein the upper and lower bodies are formed of one of stainless steel (SUS) metal, aluminum metal, and copper metal.

7. The gas injection unit of claim 5, wherein a heating unit vaporizing the deposition material is provided in the injector unit.

8. A gas injection unit comprising:
a supplying tube unit having a supplying tube to which a deposition material is supplied;
an injector unit connected to the supplying tube unit and provided with a passage communicating with the supplying tube and one or more injection holes for communicating with the passage and injecting gas; and
a deformation control plate which is coupled to one surface of the injection unit on which the injection holes are formed and, formed of metal having a different thermal expansion coefficient from the injector unit,
wherein the injector unit comprises an upper body and a lower body coupled to the upper body; a driving shaft for up and down movement and rotation is provided at a top surface of the upper body, the passage communicating with the supplying tubes is provided within the upper body; and the injection holes communicating with the passage is provided at an undersurface of the lower body.

9. The gas injection unit of claim 8, wherein the injector unit and the deformation control plate are formed of one of stainless steel (SUS), aluminum, and copper.

10. The gas injection unit of claim 8, wherein the deformation control plate is formed on a portion of or all over the one surface of the injector unit.

11. The gas injection unit of claim 8, wherein the deformation control plate is provided with second injection holes perforating in a vertical direction corresponding to the respective injection holes.

12. The gas injection unit of claim 8, wherein a heating unit configured to vaporize the deposition material is provided in the injector unit.

* * * * *